US012608521B2

(12) United States Patent
Fink et al.

(10) Patent No.: US 12,608,521 B2
(45) Date of Patent: Apr. 21, 2026

(54) GENERATION OF A DIGITAL TWIN FROM CONSTRUCTION INFORMATION

(71) Applicant: Digs Space, Inc., Vancouver, WA (US)

(72) Inventors: Ryan R. Fink, Ridgefield, WA (US); Ty Frackiewicz, Ridgefield, WA (US)

(73) Assignee: DIGS, INC., Vancouver, WA (US)

( * ) Notice: Subject to any disclaimer, the term of this patent is extended or adjusted under 35 U.S.C. 154(b) by 784 days.

(21) Appl. No.: 17/959,286

(22) Filed: Oct. 3, 2022

(65) Prior Publication Data

US 2024/0111927 A1 Apr. 4, 2024

(51) Int. Cl.
| | |
|---|---|
| *G06F 30/13* | (2020.01) |
| *G06F 30/27* | (2020.01) |
| *G06T 19/20* | (2011.01) |

(52) U.S. Cl.
CPC .............. *G06F 30/27* (2020.01); *G06F 30/13* (2020.01); *G06T 19/20* (2013.01)

(58) Field of Classification Search
CPC .......... G06F 30/27; G06F 30/13; G06T 19/20
See application file for complete search history.

(56) References Cited

U.S. PATENT DOCUMENTS

| | | |
|---|---|---|
| 2009/0024628 A1 | 1/2009 | Angel |
| 2013/0222393 A1* | 8/2013 | Merrell .................... G06T 11/00 |
| | | 345/441 |

| | | | |
|---|---|---|---|
| 2020/0134560 A1 | 4/2020 | McLinden | |
| 2021/0073430 A1* | 3/2021 | Levy ........................ | G06F 30/18 |
| 2021/0073433 A1* | 3/2021 | Austern ................... | G06F 30/13 |
| 2021/0117071 A1* | 4/2021 | Gharpuray ............... | G06N 3/09 |
| 2021/0397757 A1* | 12/2021 | Whitney, Jr. .......... | G06N 3/008 |
| 2022/0180018 A1* | 6/2022 | Soflin ...................... | G06F 30/13 |
| 2022/0406027 A1* | 12/2022 | Cini ........................ | G06T 19/20 |
| 2023/0020885 A1* | 1/2023 | Balasubramanian ... | G06F 30/27 |
| 2023/0153477 A1* | 5/2023 | Somu ...................... | G06F 30/12 |
| | | | 703/1 |
| 2023/0168665 A1* | 6/2023 | Sajanikar .............. | H01L 23/528 |
| | | | 700/97 |
| 2024/0111914 A1 | 4/2024 | Fink et al. | |
| 2024/0111928 A1 | 4/2024 | Fink et al. | |
| 2024/0111929 A1 | 4/2024 | Fink et al. | |
| 2024/0112420 A1 | 4/2024 | Fink et al. | |

OTHER PUBLICATIONS

International Search Report and Written Opinion of International Application No. PCT/US2023/032308, dated Dec. 20, 2023, pp. 1-16.

(Continued)

*Primary Examiner* — Brian W Wathen
(74) *Attorney, Agent, or Firm* — Slater Matsil, LLP

(57) ABSTRACT

Systems and methods for creating a digital twin of a structure, including facilitating communications during construction and during the structure's lifetime. Building documents such as construction plans along with vendor and contractor specifications and information may be ingested and used to automatically create a digital model of the structure. The digital model may be used to facilitate communication between various parties responsible for construction and subsequent maintenance of the structure. Other embodiments may be described and/or claimed.

20 Claims, 10 Drawing Sheets

(56)     References Cited

OTHER PUBLICATIONS

Wei, Lai. "Research on Digital Twin City Platform Based on Unreal Engine." *2022 International Conference on Information Processing and Network Provisioning (ICIPNP)*. IEEE, 2022.
Stascheit, Janosch, et al. "Building Information Modelling in mechanised shield tunnelling—A practitioner's outlook to the near future: Building Information Modelling im maschinellen Schildvortrieb-Ein praxisorienterter Blick in die nähere Zukunft." *Geomechanics and Tunnelling* 11.1 (2018): 34-49.

* cited by examiner

200

202
RECEIVE STRCTURE
CONSTRUCTION PLANS

204
EXTRACT SPATIAL AND
FEATURE LOCATION
INFORMATION

206
CONVERT INFORMATION
INTO A 2D / 3D MODEL

208
RECEIVE ADDITIONAL
DATA ABOUT
STRUCTURE ASPECTS

210
UPDATE MODEL WITH
ASPECTS

216
VALIDATE MODEL
FOR CONSISTENCY

212
PUBLISH MODEL AND
ASSOCIATED
INFORMATION

214
RECEIVE CORRECTIONS
TO 3D MODEL VIA UI

400

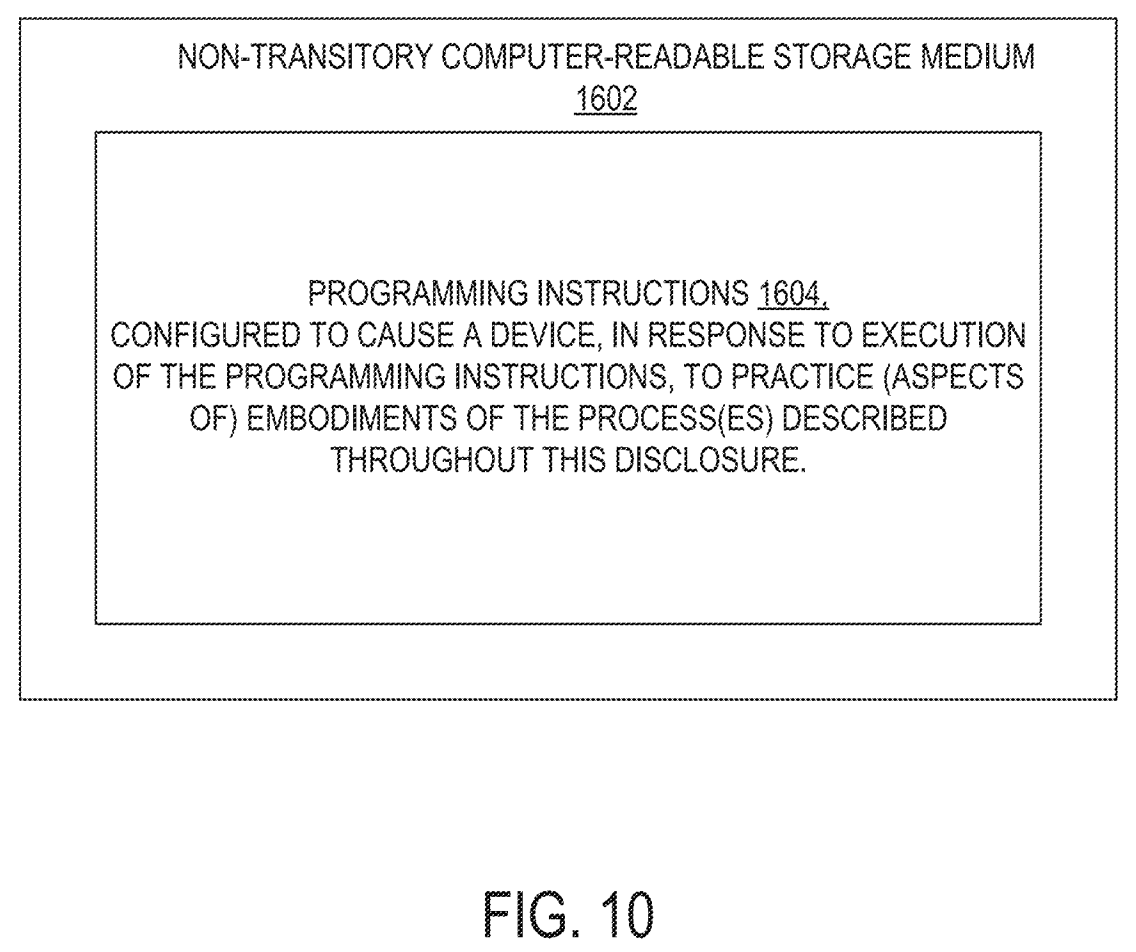

NON-TRANSITORY COMPUTER-READABLE STORAGE MEDIUM
1602

PROGRAMMING INSTRUCTIONS 1604
CONFIGURED TO CAUSE A DEVICE, IN RESPONSE TO EXECUTION
OF THE PROGRAMMING INSTRUCTIONS, TO PRACTICE (ASPECTS
OF) EMBODIMENTS OF THE PROCESS(ES) DESCRIBED
THROUGHOUT THIS DISCLOSURE.

FIG. 10

GENERATION OF A DIGITAL TWIN FROM CONSTRUCTION INFORMATION

TECHNICAL FIELD

Disclosed embodiments are directed to software related to building construction, and specifically to software that can generate a virtual or digital twin of a physical building from construction information.

BACKGROUND

Construction of a structure such as a house or commercial building involves input and/or contributions from a wide variety of different sources. Structures typically originate with a set of blueprints or similar plans which provide the basic dimensions of the building, and may specify various structural components. However, the plans only provide a framework, and do not capture the myriad details that arise during the construction process. A variety of subcontractors and vendors may contribute to various aspects of the structure. Some subcontractors may provide mechanical systems, such as heating, ventilation, air conditioning, plumbing, and wiring. Some subcontractors may be employed to specify and provide finishes, such as siding, trim, cabinetry, paint, floor coverings, etc. Still other vendors may provide various fixtures, such as lighting and built-in appliances. Landscapers may provide exterior features such as walkways, terracing, landscaping, plants, etc. Each of these different subcontractors and vendors may provide additional specifications and information relevant to the structure being constructed.

The background description provided herein is for the purpose of generally presenting the context of the disclosure. Unless otherwise indicated herein, the materials described in this section are not prior art to the claims in this application and are not admitted to be prior art by inclusion in this section.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 10 is a block diagram of a computer-readable storage medium that can be used to implement some of the components of the system or methods disclosed herein, according to various embodiments.

DETAILED DESCRIPTION

Figure 1:
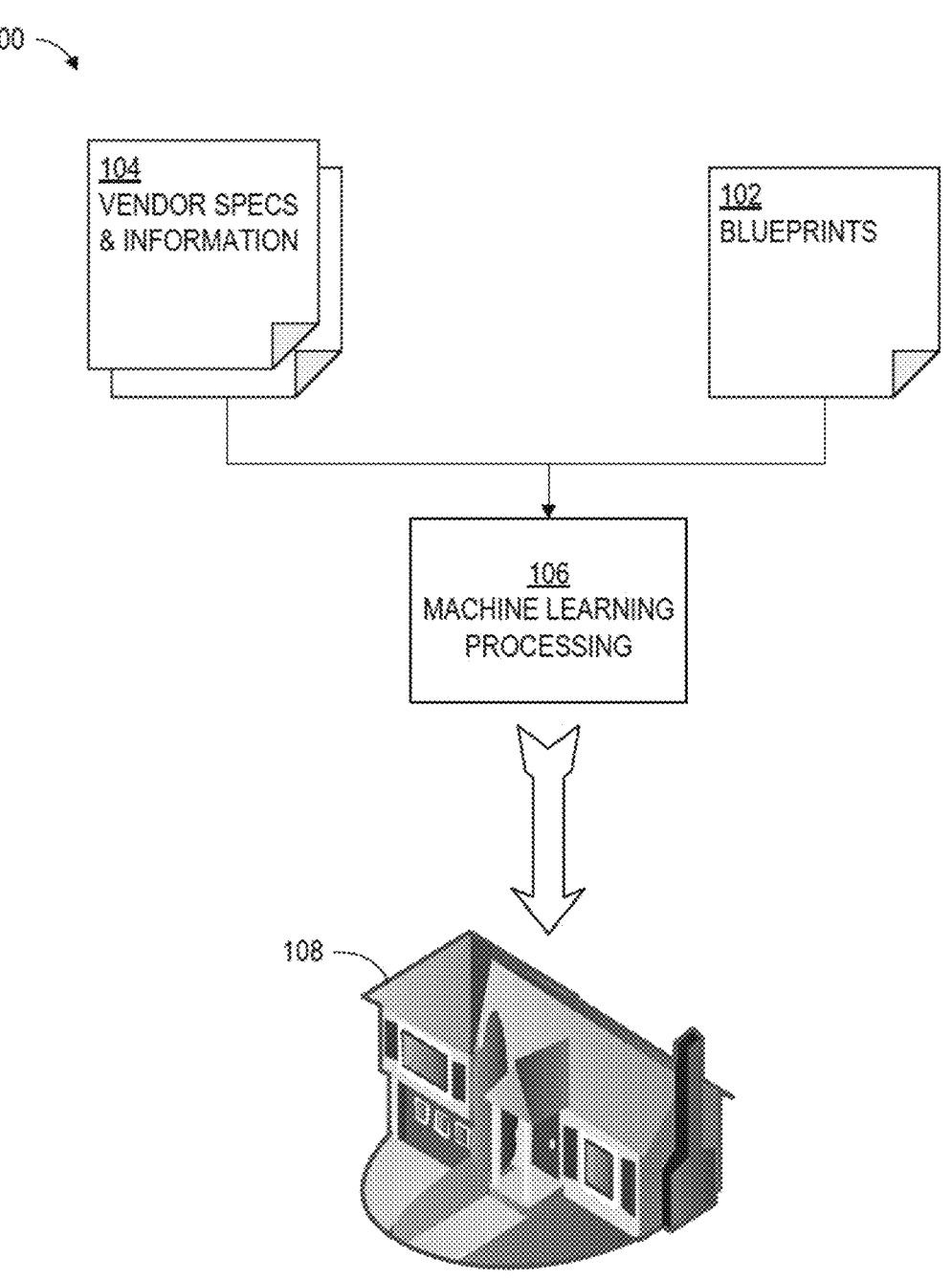
FIG. 1 illustrates an example process flow for the ingestion of blueprints and various construction related documents and conversion into a digital twin, according to various embodiments.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

Information generated by the various contractors, subcontractors, and/or vendors, such as architects, general contractors, tradesmen and subcontractors, and other suppliers, collectively form an information base that describes a given structure to be constructed. This information base is, historically, located in various disparate silos that do not always cross-communicate. The general contractor may serve as something of a clearinghouse, collecting much of the relevant information from third parties such as subcontractors and trades. However, the general contractor may not always effectively communicate information across third parties, such as informing subcontractors of changes or modifications made by other subcontractors that may impact multiple parties. Furthermore, the building owner typically provides significant input and direction throughout the process, which must be communicated to subcontractors.

The information generated by all parties during the construction of a building invariably has continuing relevance throughout the life of a building, both to the building owner, as well as to any personnel who may subsequently work on or service the structure and/or its fixtures. For example, the information may include appliance information such as makes, models, and serial numbers, as well as installation, operation, and maintenance information. Construction plans can be helpful if the structure is remodeled or renovated for determining the location of relevant structures. Information about fixtures and finishes can be useful if repairs or replacements are necessary, to help obtain matching mate-rials.

While manuals for various appliances and fixtures are typically retained and passed on from owner to owner of a structure, plans are not always available, and information about various fixtures, finishes, etc., may not be retained by the contractor or builder and passed on to the structure owner. During the construction process, as noted above, vendors/subcontractors may not always have access to all information that may impact on their services.

Still further, over the lifetime of a structure, specifications may change. For example, remodeling or renovation may result in changes to fixtures, finishes, materials, and even structural aspects of a structure. Trends in interior and exterior design change over time, and structures may be periodically updated to reflect current trends, particularly if the structure is sold. Appliances are often updated as they age and require replacement and/or become obsolete. A house that is several decades old may bear little resemblance in at least some aspects to the house when it was first constructed. Current information about a structure can facili-tate subsequent updates, remodels, and renovations, and should accordingly be updated to remain current following such updates. Moreover, having current information about a structure can save time and money in the process of updat-ing, remodeling, and/or renovating.

Disclosed embodiments include a system for ingesting construction information and generating a digital represen-tation or twin of the structure. The digital representation can act as a persistent repository and database of structural knowledge from initial construction through the life of the structure. Plans, drawings, and/or blueprints may be ana-lyzed to extract structural information such as floorplans, positions of windows, doors, and other structures, insulation specifications, foundation specifications, structural concrete/ masonry work, along with scale and dimensions. Some information may be extrapolated. For example, building layouts are often two-dimensional (such as blueprints), but may specify height of ceilings in textual call-outs, specifi-cation of lumber dimensions, and/or in another accepted fashion.

To this initial structural information, other related infor-mation such as vendor specifications and/or information is added. The vendor information may include specifications for plumbing, electrical, and HVAC systems such as heating/ cooling type, furnace/boiler specifications, air conditioner/ heat pump specifications, duct and ductwork locations, gas line routing, etc. Other information may include roofing type and color, siding and finish types/colors, paints, textures, flooring types/colors, masonry and other exterior features, cabinetry, lighting fixtures and light bulb types, plumbing fixtures, other fixtures, electronics such as smart home controls, sensors, alarm systems, networking, cable/Internet, and appliances and associated appliance information such as operation manuals, installation manuals, warranty informa-tion, and maintenance/servicing information. The foregoing is not intended to be an exhaustive list, but rather examples of information types. Vendor specifications and/or information may include any information related to the structure that may not otherwise be included on the construction plans. For example, in some embodiments, the information may extend to homeowner-provided items such as furniture.

Embodiments may merge the structural information with the vendor information to generate an interactive 2D and/or 3D model of the structure. Merging may be done using artificial intelligence/machine learning, which may aid in extrapolating information that is not otherwise provided in the structural information and vendor information. This model, in turn, may be manipulated and annotated by a user, such as a contractor or structure owner. Furthermore, the model may be used to coordinate information exchange with vendors and the structure owner during the construction phase, and later by the structure owner in maintaining the structure, e.g. to help convey pertinent information to ven-dors such as service technicians and contractors. Still fur-ther, in embodiments, an owner may use the digital model to visualize placement of furniture, different finishes, possible remodels or renovations, and other structural aspects.

In some embodiments, an owner or contractor may be able to share the interactive model with third parties, such as a contractor who may be preparing an estimate for a pro-posed renovation, another stakeholder who may desire infor-mation about the structure or may wish to propose changes, or vendors to help prepare quotes for appliances or other fixtures. The model may allow disclosure of otherwise hidden structural features, such as the placement of wiring, HVAC ductwork, plumbing, and structural members. Simi-larly, providing access to the model to third-party vendors may allow vendors to update the model to reflect any work done, provide manuals to any installed equipment, update specifications that may be out of date In some embodiments, the digital model and its associated information may be stored in a cloud service or remote digital repository. A current structure owner may be able to pass access of the digital model to a subsequent owner, so that the subsequent owner can have a comprehensive knowl-edge of the structure and its systems, as well as any pertinent information about appliances, fixtures, etc. In this way, the risk of information that was formerly stored in hard copy that could be lost is obviated.

In still other embodiments, the digital model can be used in conjunction with augmented reality (AR) or virtual reality (VR) technology to allow a person to simulate a walk-through of the structure that approximates being physically present in the structure. Alternatively or additionally, a user may be able to use an AR-equipped device within the structure to view annotations about various structural aspects, e.g. pointing the device at an appliance to access make, model, and instructional information; pointing the device at a wall to visualize the placement of electrical lines, plumbing lines, ductwork, structural members, etc.; using the device to visualize placement of furniture, appliances, and/or other items within the structure; and any other similar functionality. Other functionality may include interfacing with vendors to allow for quick ordering of any supplies, materials, and/or replacement parts relevant to different aspects of a structure, such as appliance parts, paint colors, flooring types, light bulbs, plumbing parts, etc.

FIG. 1 illustrates a process flow 100 for integrating structure design plans and associated specifications and other related information to generate a digital twin. In process flow 100, a set of blueprints 102 providing the design for a structure are combined with vendor specifica-tions and information 104. The blueprints 102 and informa-tion 104 are provided to a machine learning system 106, which then generates a digital model 108 that integrates the specifications and information 104 with the blueprints 102. The digital model 108, then, effectively acts as a digital twin of the physical building to be constructed according to the blueprints 102 and information 104. Process flow 100 may be implemented on a single device, such as a computer device 1500 (FIG. 9) that may implement a laptop, desktop, server, or mobile device, or on multiple devices, such as a cloud computing facility or data center. In some embodiments, process flow 100 may be implemented in parts on multiple different devices, e.g. blueprints 102 and information 104 may be received and at least partially processed on a first device, processing with a machine learning system 106 may occur on a second device, and rendering of the digital model 108 may occur on a third device. Other variations may be possible while keeping within the scope of this disclosure.

The blueprints 102 may be any suitable set of plans as may be accepted and/or commonly used in the construction industry. For example, in some embodiments, blueprints 102 may be plans drawn up by an architect or contractor. The blueprints 102 may be two-dimensional plans, as typically used in many constructions projects, and/or may be or may include 3D renderings. In embodiments, the blueprints 102 may further include various markings that indicate scale, dimensions, locations of various features, materials specifications, and/or other information relevant to the construction of the structure. A non-exhaustive list of possible structural aspects provided by blueprints 102 was discussed above. The blueprints 102 may be provided in any suitable format, such as an image, PDF, or CAD file, or another known or commonly used architectural file format. In some scenarios, the blueprints 102 may be in a paper format, in which the blueprints 102 will need to be scanned or otherwise digitized, and placed into a suitable format. In some embodiments, the blueprints 102 may be in multiple different formats.

The vendor specifications and information 104 may be any information or type of information that is relevant to the structure being constructed, pursuant to blueprints 102. Information 104 may include one or more inventory lists of various supplies, building materials, appliances, etc., necessary for completing the structure. Information 104 may further include specifications of exterior finishes, e.g. paint and/or stain type; lighting; electrical; plumbing; HVAC specifications and systems; appliance information such as make, model, serial number, installation instructions, operation instructions, and warranty information; flooring; siding; stone, rock and/or wood features, such as fireplaces; and fixtures such as cabinetry and shelving. Information 104 may further include information about features that are not fixtures or may not otherwise be attached to the structure, such as furniture and electronics. A non-exhaustive list of possible information that may be included in information 104 was discussed above. As with the blueprints 102, the information 104 may be supplied in a digital format such as image files, text files, PDF files, HTML files, XML files, Excel files or other standard office program formats, and/or another suitable file type. Where information 104 is in a hard copy format, the information 104 would need to be digitized. In embodiments, information 104 may be provided in a variety of different formats. For example, where information 104 comes from a number of different vendors, each vendor may supply information 104 in a different format or multiple different formats.

The blueprints 102 and vendor specifications and information 104 are inputted into a machine learning system 106 via a suitable interface. Accordingly, the blueprints 102 and information 104 must, in embodiments, be in a digital or machine readable format. The type of format will depend upon the specifics of a given implementation of the machine learning system 106. Suitable formats may include, but are not limited to, PDF files, image files, text files, HTML files, XML files, CAD files, and/or another suitable file type. Machine learning system 106 may perform varying degrees of preprocessing depending upon the particular type of file input into system 106. In some embodiments, a separate pre-processor (not shown) may precede the machine learning system 106 and/or be part of the machine learning system 106 to convert or otherwise process the various files input into a common format or suitable intermediate format useable by the system 106.

The interface into the machine learning system 106 may be any suitable interface that can accept files and forward them to the machine learning system 106 or pre-processor for input into the machine learning system 106. For example, in some embodiments, a drag and drop interface may be employed, such as is commonly found on many web browser interfaces for cloud computing systems. The interface may be part of an interface that also allows viewing and/or interaction with the digital model 108 and associated information, as will be discussed in greater detail below.

Once the various files comprising blueprints 102 and vendor specifications and information 104 have been supplied and any necessary preprocessing is complete, machine learning system 106 then processes the various input files to extract information necessary to create the virtual or digital model 108 (hereinafter, "digital model"; "virtual model" is synonymous). The necessary information may be extracted using a machine learning process such as an artificial neural network (ANN). When implemented using an ANN, the ANN may be initially trained using a collection of a variety of different types of building-related information. The collection may include a variety of blueprints, such as would be considered blueprints 102, as well as a wide variety of building-related information, such as would be considered information 104. The training information may then be validated on a test set. Furthermore, in some embodiments the ANN may be configured to feed back the results of each set of blueprints 102 and information 104 into the ANN as well as any adjustments made by a user (discussed below) to improve the accuracy of the machine learning system 106 over time.

While machine learning system 106 may be implemented using an ANN in some embodiments, this should not be construed to be limiting. Machine learning system 106 may be implemented using any suitable technology, method, or technique suitable to convert blueprints 102 and information 104 into digital model 108.

Digital model 108 may be presented in a number of different formats, depending upon the specifics of a given embodiment. Digital model 108 may include a cartoon version, a photo realistic version, a genericized version where privacy is a consideration, and may be provided in 2D and/or 3D versions. Furthermore, digital model 108 may, in embodiments, be usable to generate a variety of different types of representations of the structure formed from blueprints 102 and information 104.

In embodiments, digital model 108 may be rendered to provide an approximation of both the structure as defined by blueprints 102 as well as the various aspects provided by information 104. Thus, a digital model 108 may reflect the floor plan and position of various features such as roof lines, windows, doors, and the position of various fixtures, as indicated by blueprints 102. The exterior and interior may be textured to reflect finish choices such as siding, roofing, masonry and/or stone features, flooring, and paint, as indicated by information 104. Fixtures indicated by blueprints 102 and/or information 104 such as plumbing fixtures, electrical fixtures, cabinetry, trim, and other fixtures may be rendered into digital model 108. If provided by information 104, exterior features such as landscaping, walkways, water features, etc., and interior features such as appliances and/or furniture may be added to digital model 108. As will be understood, any other information that is provided or can be extrapolated from blueprints 102 and information 104 may be used to create a relatively accurate digital model 108.

Digital model 108, in embodiments, may be presented in a user interface that allows for interaction with the model and/or to vary or modify the format presented, such as selecting from one or more of the example versions listed above. The user interface may further allow digital model 108 to be edited. Depending upon the type of interface used for interacting with the digital model 108, various parts of information 104 or information derived from information 104 may be accessible to a user of the interface. For example, viewing an appliance presented in the digital model 108 may allow the user to access information about the appliance, such as a manual, while viewing or inspecting a surface may allow the user to access information about the surface finish, e.g. paint color, siding type, flooring type, etc., depending upon the nature of the surface being viewed. The user interface will be discussed in greater detail below with respect to FIGS. 5-8.

It should be understood that process flow 100 may be used for both initial creation of the digital model 108 as well as subsequent iterations and updates of digital model 108. For example, once a digital model 108 has been created, an owner of the structure represented by the digital model 108 may utilize an implementation of process flow 100 at a later time to process additional and/or updated vendor specifications and information 104. This additional and/or updated information 104 may be generated as part of a remodel or renovation of the structure, changing of appliances, altered exterior/interior finishes, additions/changes/deletions of fixtures, and/or other any other changes to the structure that are or should be reflected in the digital model 108 to ensure it continues to accurately reflect its corresponding structure.

Figure 2:
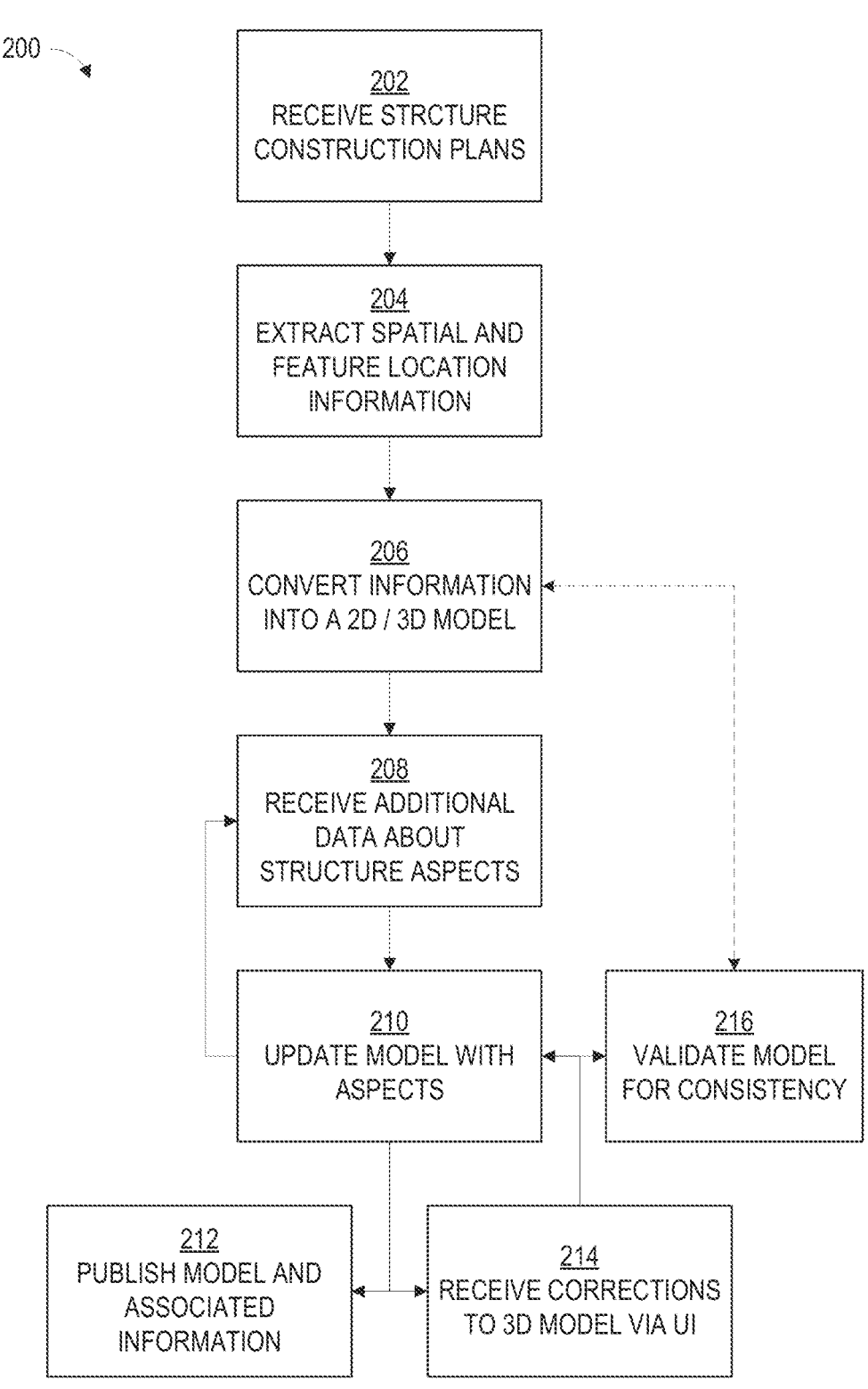
FIG. 2 is a flowchart of the operations for creation of a digital twin from construction related documents, according to various embodiments.

FIG. 2 illustrates the operations of an example method 200 for generation of a digital model or digital twin of a structure from blueprints or construction plans and other related structure information. Method 200 may, for example, provide an implementation of process flow 100 (FIG. 1), to be executed on a computer device 1500. Depending upon the needs of a specific embodiment, the operations of method 200 may be performed in whole or in part, in the depicted order or out of order. Some operations may be omitted or additional operations added.

In operation 202, construction plans for a structure are received. The construction plans may be, in embodiments, blueprints 102 (FIG. 1), and/or another suitable or acceptable form of structural plans. Structure construction plans further may include related vendor and/or contractor specifications and information. This information may be, in embodiments, information 104 (FIG. 1), and/or another suitable or acceptable form of vendor information. The plans, specifications, and information may be received in a user interface which allows for uploading of files. The plans, specifications, and information may be provided in a single file or in multiple files, and may be provided in multiple different formats. For example and as discussed above with respect to FIG. 1, blueprints and diagrams may be provided in a PDF or CAD format, while specifications and information may be provided in a PDF, Word, or Excel format. In some embodiments, the user interface may allow desired files to be dragged and dropped into the interface to initiate automatic uploading and subsequent processing. Alternatively or additionally, any other suitable method for ingestion of files may be employed.

Once the construction plans are received, in operation 204 spatial information and feature location information is extracted from the construction plans, and possibly the specifications and information. This spatial information may include ingestion of floor plans, including wall lengths, wall features such as doors and windows, and spatial relationships between the various walls. Spatial relationships may include angles between walls, e.g. 90 degrees, 60 degrees, 45 degrees, 30 degrees, etc., as well as the placement of walls relative to each other, e.g. where walls join to or extend from each other. Spatial location may further include information such as wall height, ceiling height, roof line and roof profile. Feature location information may include the location of doors, windows, and other features on associated walls. Spatial information and feature location information may further include structural information, such as joist and rafter placement, stud spacing, dimensional lumber size (e.g. 2×4 or 2×6 wall stud size, joist size, rafter size), insulation requirements and values, and masonry specifications (e.g. concrete slab thickness, foundation wall thickness and construction type, placement of any rebar, size of foundation footings, etc.).

With respect to vendor/contractor specifications and information, spatial information may include the location and dimensions of various fixtures, such as cabinet location and placement; appliance location and placement; ventilation placement; requirements for various fixtures such as structural/loading demands, space demands, and plumbing, gas, and/or electricity/power needs; square footage requirements; and quantity requirements. Some of these aspects may include both spatial and operational needs. For example, specified appliances may have both spatial needs, such as a location with sufficient dimensions, clearances, structural loading, and proximity to any utility taps, as well as operational needs, such as electrical circuit requirements, cold/hot water access, ventilation needs, sewer access, and/or or data network access. HVAC systems and water heaters may have specific power requirements, and may require gas service. Furthermore, in various embodiments, some information may be referential. Appliances and/or equipment may include various types of literature, such as installation manuals, operation manuals, service manuals, warranty information, and other related documentation. In addition to providing operational guidance, such documentation can also be used to determine spatial and operational requirements, such as by extracting information from an installation manual.

In embodiments, extraction may utilize various processes depending upon the format of the spatial and feature location information. For example, where the information is provided in text format, parsing of the text using various processing methods may be employed. Where the information is provided in an image format, image recognition, object recognition, and/or optical character recognition (OCR) techniques may be employed as appropriate to extract information for analysis. Where the extracted information is text, the recognized and extracted text may then be processed using text parsing techniques similar to those employed for text files. In hybrid formats where both image and text may be present, such as PDF files, a combination of techniques may be utilized, as appropriate to a given portion of the file. The processing and extraction may further rely upon understanding the format of the information to determine what information is relevant and should be extracted. For example, vendor quotes and specifications may include various terms and ancillary information that is of marginal or no relevance to building a digital model, and such information may be safely ignored. Context of the information may help assess what information is relevant. Context may include, but is not limited to, the vendor, vendor type, equipment/materials being supplied, related services, and external information such as spatial information and related information ascertained from the construction plans and other vendors.

In some scenarios, the information may be provided in a standard format, such as a table or a spreadsheet, where data can be logically associated with tags or metadata that describes the nature of the data. A table may label data such as quantities, model numbers, descriptions, and/or other headings or descriptors which may facilitate processing and categorization. Where information is extracted from drawings or figures, labels may be present within the drawings or figures, or may be present in a key or legend. In other documents, glossaries, legends, keys, indices, and tables of abbreviations or other notations may be located apart from key information but understood to be useful in decoding and understanding the key information.

In embodiments, machine learning processing, such as a machine learning system 106, may perform part or all of the extraction of the spatial information, feature location information, and related vendor/contractor specifications and information. The machine learning processing may rely upon an ANN that has been trained to understand the various formats of data, both construction plans and vendor/contractor information and specifications. The trained ANN may thus recognize and classify the various extracted information, including information relevance, information type (e.g. metadata, labels, or data), and raw data useful for constructing the digital model. The ANN(s), in embodiments, may be of any suitable type that can be trained to recognize, process, and extract relevant data from construction-related documents. In some embodiments, multiple ANNs may be utilized, with different ANNs employed depending upon the data type. For example, one ANN may be used to classify document type, e.g. blueprints, vendor specifications, informational manuals, installation instructions, etc., which can then be used to route the classified document type to one or more additional ANNs that are trained to extract data from a given document type. In some embodiments, one or more of the ANNs may be configured in a feedback arrangement, where human interaction with classification results can be fed back to the ANN to retrain and enhance subsequent classifications. The extraction processes will be described in greater detail below, with reference to FIGS. 3 and 4.

Following information extraction, in embodiments, in operation 206 the extracted information is converted into a digital model, which may be 2D, 3D, both, and/or another suitable format. The digital model may be, for example, digital model 108. Spatial information derived from the construction plans may be used to render the basic structural layout, such as wall placement, height, roof line, and exterior elevation. Rendering of the model may employ any suitable technique now known or subsequently developed. Provided the construction plans are drawn accurately to scale and/or the plans specify dimensions (such as where plans may not be drawn to scale), the resulting digital model may correctly reflect the actual proportions of the structure to be constructed. Rendering may also include locating and rendering features such as doors and windows that are indicated on the construction plans.

Furthermore, features of the structure not normally visible, such as materials inside a wall, may be rendered and potentially be capable of being viewed in the digital model. For example, routing of plumbing lines, electrical lines, HVAC ductwork, drain/sewer lines, ventilation pipes, and similar structures may be rendered into the digital model. Such information may be extrapolated from the construction plan indications of outlet locations, sink locations, toilet locations, tub/shower locations, utility access points, mechanical room designations, foundation schematics, etc. In some instances, such information may be partially or wholly determined from vendor/contractor specifications.

Once the spatial information from the construction plans has been rendered, the information obtained from vendor/contractor specifications and information may be used to "flesh out" the basic rendered structure. Information about finishes, such as paint, siding, trim, floor coverings, rock/stone features, and refining of window and door information may be rendered onto the structure to create a digital model that approximates how the completed structure will appear when built.

For example, the construction plans may specify the location and size of a door; however, doors of a given size may be available in a vast array of different appearances. A vendor or the contractor may specify the particular type of door in a separate document. By incorporating the type of door, the actual appearance of the finished doorway can be better approximated instead of employing a generic placeholder door. Still further, a different vendor may specify the paint or finish of the door, which can be further rendered onto the door as a texture. For a second example, the construction plans may only specify a window dimension, e.g. 4'×6'. However, the style and type of window may not be specified, such as whether the window opens, if it opens via a casement mechanism or a sash, whether the window is single- or double-hung, whether the window opens vertically or horizontally, or from the top, left, right, or bottom. Still further, the type of the window frame, e.g. wood, vinyl, metal, or another material; the style of the window frame, and the color of the frame, may not be specified. All these various aspects may be specified in a separate document. For a third example, the construction plans may not specify a siding type, e.g. LAP siding, fiber-cement board, cedar planks, wood shake, vinyl siding, metal siding, or another type, and likewise may not specify the color of the siding; these various details may be available in separate contractor or vendor specifications. The foregoing are just a few examples; a person skilled in the art will readily understand that numerous structure details may only be ascertained by combining construction plans with vendor/contractor specifications.

In addition to finishes, in embodiments, fixtures may be rendered. The location of lamps, sinks, toilets, showers, cabinetry, mechanical equipment, and various appliances may be specified on construction plans. By incorporating vendor/contractor specifications and information, which may include makes and models of the various fixtures, the actual appearance of the installed fixtures may be approximated. For example, the configuration of cabinetry, including number of cabinets, sizes, and styles may be ascertained from cabinet suppliers. Sink appearances, faucet appearances, toilet appearances, and tub/shower appearances may be ascertained from plumbing specifications. Light fixture appearances, even bulb appearances, may be ascertained from electrical specifications. The appearance of kitchen appliances, such as refrigerators, dishwashers, ovens, microwaves, ranges, and other built-in appliances may be obtained from appliance vendors. As above, the foregoing are just a few possible examples.

Exterior features such as landscaping may also be rendered if such specifications are supplied.

The result of operation 206 is a digital model that can be viewed by a user via a suitable user interface. The digital model may further be interactive, where a user may be capable of sectioning portions of the model. For example, a user may be able to section into a wall, to view the location of structural members such as studs, pillars, beams, joists, and rafters, and/or the location of plumbing, electrical, and HVAC runs. Furthermore, the digital model, when interactive, may have various components tagged. In some embodiments, when manuals and documentation for a given appliance or fixture have been ingested in operations 202 and 204, the manuals and documentation may be viewable or accessible from within the model by viewing the digital representation of the appliance or fixture. Viewing a dishwasher, for example, may present a user with the option to access any associated documentation. Similarly, viewing other aspects of the digital model, such as siding or flooring, may allow a user to pull up information such as the siding type and color, any applied paint and associated color or color codes, or for flooring, the type of flooring.

In some instances, the vendor/contractor specifications or information may lack sufficient information to allow rendering directly from the ingested information. A faucet, for example, may be specified by a model or part number from a plumbing supply house, but without a corresponding image. In such instances, operation 206 may include referencing the model or part number with the manufacturer, who may be able to supply a corresponding image suitable for rendering. This approach may also be applied to aspects such as color, where a color or paint code may be supplied. The color or paint code may be cross-referenced against a manufacturer database to obtain the proper color values for correct rendering. This approach may further potentially be utilized for any aspect of the structure design where the ingested construction plans and information lack corresponding imagery or sufficient information to allow for direct rendering.

Where available, 3D models of various rendered objects for the digital model may be obtained to provide a relatively realistic view within the digital model, such as when the digital model is presented in 3D. However, where 3D models are not available, such as where only a 2D photo or photos of a fixture is/are available from fixed perspective(s), a model may be approximated. In some embodiments, machine learning may be used in conjunction with the photo or photos to extrapolate a 3D approximation of the fixture.

In operation 208, in embodiments, additional data or information about structural aspects may be received at times subsequent to the initial creation of the digital model. The information may include updates to the structure, such as resulting from changes during the construction process. Construction plans may be modified, and/or a vendor may provide updated specifications or information. Additional features or fixtures may be added or deleted. The information may also include updates by a structure owner following completion of the structure. As discussed above, remodeling or renovations, including changing paint schemes and landscaping alterations, may result in changed or additional specifications or information. In some embodiments, a user may supply information about personal items, such as furniture and decorations, that will be placed inside or about the structure. Such information may include make and model of the furniture, and may also include placement within the structure. When such information is supplied, it will be understood that the digital model will be updated to reflect the presence and placement of such personal items.

When an updated file or set of specifications is supplied, the implementing system may first compare the updated file to the existing model and specifications, and determine which aspects have been changed. This may allow a reduction in processing time by avoiding updating or regenerating portions of the digital model that are unaffected or unchanged by the updated specifications. In some embodiments, the updated file or set of specifications may be identified as being older than the previously submitted specifications, such as by identifying a date code or stamp within the file or specifications. In such an event, the system may prompt a user to confirm that the digital model is to be updated to the apparently older specifications.

In embodiments, the additional information may be supplied via a user of the digital model (discussed below with respect to operation 214), such as through an interface through which the user interacts with the digital model and can directly provide changes and/or additional information. Alternatively, in some embodiments the changes may alternatively or additionally be supplied in the form of updated versions of documents that were initially supplied in operation 202 to create the initial version of the digital model. Where updated document versions are supplied, the documents may be re-ingested and information extracted via the techniques described with respect to operation 204.

In operation 210, the digital model created in operation 206 is updated using the additional data or information received in operation 208. The process by which the digital model is updated is substantially identical to the process by which it is created in operation 206, and the user is directed to the above discussion of operation 206. As a result, provided that information about the structure reflected by the digital model is kept up-to-date, the digital model will always provide a relatively accurate rendition of the structure during its lifespan.

It should be understood that operations 208 and 210 roughly correspond to an iteration of operation 204 (where the additional information requires extraction and/or machine processing) and operation 206.

In operation 212, the resultant digital model and any associated information, such as tagged documentation and specifications as discussed above with respect to operation 206, may be published. Publishing of the digital model may include making the model shareable or otherwise available over a network or via an online interface or application programming interface (API). For example, a digital model may be viewable through various interfaces including a portal or page that is web-browser accessible, or via a dedicated application that provides a front-end interface. These interfaces may include functionality that allows a user with appropriate permissions to share parts or all of the digital model. Furthermore, sharing of the digital model, in whole or in part, may include control over aspects of sharing, e.g. read or view only access, read/edit access, read/edit/delete access, etc. Sharing will be discussed further below with respect to FIG. 5.

In operation 214, corrections/edits to the digital model may be received via the user interface, mentioned above in the discussion of operation 208. Depending upon the functionality of the interface, the corrections/edits may be entered directly by a user interacting with the digital model and/or by providing additional or updated specifications or information, to be processed per operations 204 and 206, discussed above.

As can be seen in FIG. 2, corrections may be supplied for operation 210 from either a user interface, per operation 214, or from an external third party via a published application, per operation 212. For example, where a user has published the model and granted some form of edit access, edits made by the third party may be received similar to corrections received via interaction with a user interface, per operation 214. These edits may then be used to update the model, per operation 210.

In some embodiments, the corrections and/or additional information such as supplied through user interface per operation 214 and/or third party via published application per operation 212 may be processed in real time or near-real time, as the changes are received, with the digital model being immediately updated, per operation 210. With such an interaction, changes can be reflected to the digital model essentially in real time, as they are entered. In addition to changes to plans that may result during construction, ongoing changes may be reflected. For example, a homeowner of a house with a digital model could grant access to a home improvement store. When the homeowner purchases an appliance, such as a refrigerator, the home improvement store could automatically transmit the purchase and the relevant specifications and information, such as manuals, model, dimensions, color, etc., to the homeowner's digital model. The model would then automatically update, so that the homeowner could immediately see the new appliance in place.

Finally, in some embodiments, the various inputs of spatial information, vendor/contractor specifications and information, and/or subsequent edits or revised specifications may be used to validate the model for consistency in operation 216. For example, the construction plans may indicate a particular space available for cabinetry. Vendor specifications may list the dimensions of the cabinets intended for installation, or may allow the dimensions to be ascertained. In operation 216, these dimensions can be verified against the available space to ensure that the specified cabinets will correctly fit into the available space. If it is determined that the specified cabinets will not correctly fit, an alert or notification may be provided to inform users of the discrepancy. This validation may be carried out for any aspect of the digital model and associated specifications, such as appliance fit, or utility service, e.g. an appliance may require 240V service but electrical specifications do not indicate such a circuit being placed where the appliance is to be installed. Thus, operation 216 can allow for detection of improper specifications and/or miscommunications, potentially saving time and money by allowing mistakes to be caught prior to actual installation. Operation 216 may be performed upon initial creation of the digital model (represented by the dashed line between operation 216 and operation 206) as well as each time the digital model is updated in operation 210, to ensure the digital model remains consistent with its specifications and/or to help avoid construction delays or other situations that may cause an increase in construction costs.

Method 200 may implemented in whole or in part on any system or network of systems that implements process flow 100. Depending on the requirements of a given implementation, portions of method 200 may be executed on a user device, such as ingestion of documents and specifications, while other portions may be executed on a server, such as a network server, data center, or cloud service, such as machine learning processing of the information and/or generation of the digital model. Furthermore, the server may act as a cloud-available repository of the various specifications and information associated with the digital model, in addition to supplying the digital model itself. In still other embodiments, one server may provide the digital model, while a second server may act as the information repository, and a third server may provide machine learning processing.

Figure 3:
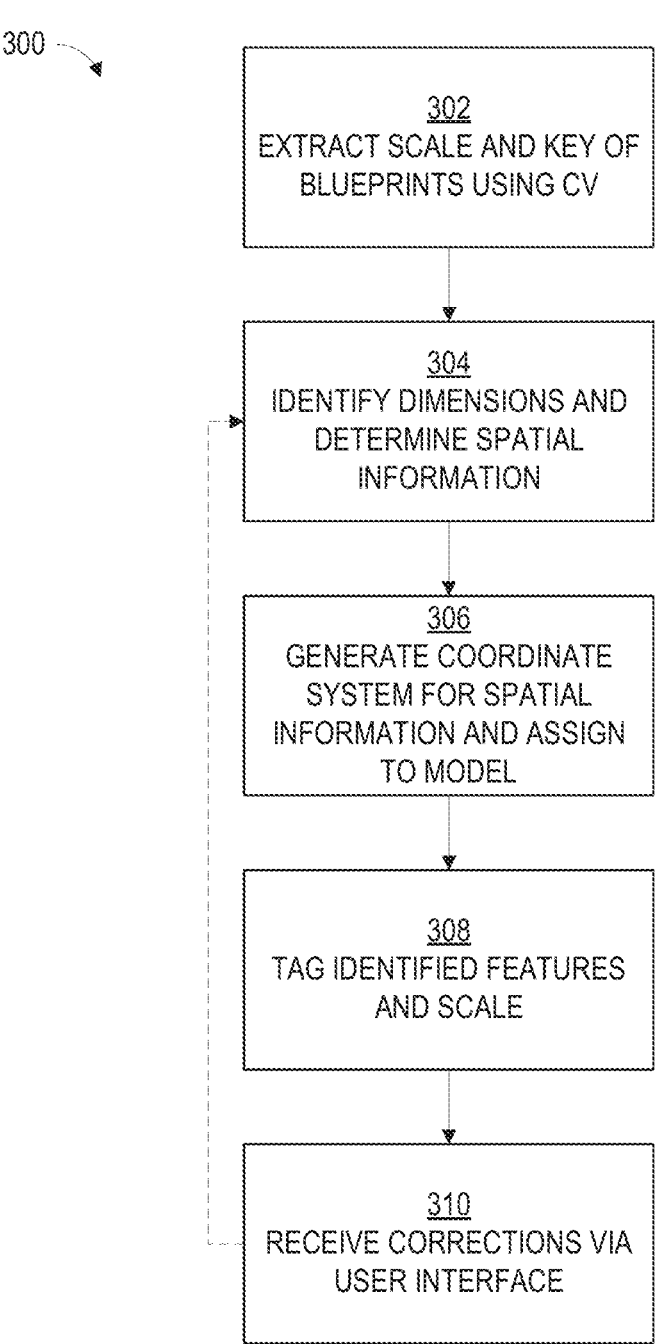
FIG. 3 is a flowchart of the operations for extraction of information from a set of blueprints or construction plans for creation of a digital twin, according to various embodiments.

FIG. 3 illustrates the operations of an example method 300. Method 300 illustrates possible operations for extraction of spatial information from construction plans such as blueprints 102 (FIG. 1), to be executed on a computer device 1500. Thus, method 300 may be considered part of at least operation 204 of method 200. Depending upon the needs of a specific embodiment, the operations of method 300 may be performed in whole or in part, in the depicted order or out of order. Some operations may be omitted or additional operations added.

In operation 302, the scale and key are extracted from the blueprints and/or construction plans that have been previously provided, such as in operation 202 of method 200. As described above with respect to method 200, any suitable method may be employed for extracting this information. In some embodiments, a form of computer vision may be employed, such as optical character recognition (OCR), object detection and recognition, or another suitable technique now known or later developed. The extracted information may be obtained from, for example, a legend or key on the plans, as well as scale information that may be supplied on one or more of a set of drawings. The scale information may indicate some real-world distance associated with an indicated length in the drawing, as would be understood by a person skilled in reading blueprints. The real-world distance is typically numerically indicated, and so detectable by techniques such as OCR. The length in the drawing may indicated by some graphic length, which may be recognized as a set number of pixels or other elements. Accordingly, the set number of pixels can be associated with the indicated real-world distance. Alternatively or additionally, each pixel or element can be associated with a set real-world distance by dividing the indicated real world distance by the number of pixels of the graphic length.

With fixed real-world lengths associated with pixels or other elements, the real-world lengths of the various structures indicated in the plans can be calculated. As will be understood, the precision with which the lengths can be calculated will depend on the resolution of the provided drawings. Higher resolution images may have more pixels/elements per line segment and so associate a smaller real-world distance with each pixel/element, in turn resulting in an increasing precision in calculation of real-world distances for the various structures.

In some instances, if a drawing is made to a consistent scale but lacks scale markings, the overall scale may be ascertained from specific measurements called out within the drawing. For example, if a wall is labeled with its measurement, this measurement may be used to determine a scale applicable to the overall drawing, with the measurement label and graphic length of the associated wall acting as the scale information, and the per-pixel or per-element length calculated as described above when an explicit scale is provided.

In some drawing conventions, lines that are shortened for convenience may be indicated, such as with a marked break in the line. Such markings may be detected, and so indicate that the pixels or elements in the broken line cannot be used to calculate its distance. Furthermore, some drawings may not be drawn to scale. A system implementing method 300 may be able to detect such drawings, such as where multiple walls have associated measurements, and calculating the per-pixel or per-element lengths for each wall results in multiple inconsistent per-pixel/element lengths. In some drawings, the drawing may be explicitly labeled "NOT TO SCALE" or with similar terms, which may be detected via OCR or computer vision, and signal that only explicit measurements may be relied upon.

It will be understood by a person skilled in construction arts that, depending on the nature of the drawings or plans, operation 302 may be unnecessary in favor of operation 304 (described below) and/or operations 302 and 304 may essentially be combined. Computer vision techniques may similarly be used to analyze the drawings or plans to ascertain whether a scale and/or key is present.

In operation 304, dimensions of illustrated structural features are identified to determine spatial information such as dimensions and relative positions of the illustrated structural features. In some instances, this may involve using the scale and key information extracted in operation 302 in connection with the illustrated structure to determine the various lengths of depicted structures. In other instances, the spatial information may be embedded within the construction plans. For example, a set of blueprints may include dimensions proximate to each depicted wall or feature, sometimes with corresponding arrows to indicate the precise limits of the indicated dimensions.

Other spatial information may be identified and/or computed once the scale and key have been determined. Items such as floor area for each structure level, including partial areas such as rooms and hallways, can be computed once the lengths and dimensions of the various walls are known. Roof area can also be calculated from data such as roof slope or pitch specifications, along with framing plans that specify rafter layout and/or other data that illustrates the structure's roofline at scale. If the height of walls is specified, wall area can be determined, which may either include or omit window and door area.

In operation 306, a coordinate system is generated for the spatial information, and is assigned to the digital model, such as the model generated in operation 206 of method 200. Generating the coordinate system, in embodiments, may include determining some point on the structure to designate as an origin, such as corner of the structure at a ground level. The location of various objects placed within the structure can then be placed with reference to the origin.

Further, the coordinate system may be tied to a uniform scale for the model. Construction plans may be provided across multiple sheets, and while all may be drawn to scale, it is possible that not all construction plans may share the same scale, e.g. the initial set of plans may have a scale of 1 centimeter to 1 meter, while a set of revised plans may have a scale of 0.75 centimeter to 1 meter. Generating the coordinate system may include assigning all extracted spatial information to a common scale, which may be accomplished by using the scale determined for each set of plans to convert measurements into real-world measurements, then converting to the uniform scale assigned to the digital model.

In operation 308, any features identified from the construction plans are tagged to the spatial information, which may be represented as a digital model, such as the one created in operation 206 of method 200 (FIG. 2). Tagged features may include doors, windows, cabinets, plumbing fixtures, lighting fixtures, wall sockets, mechanical equipment, appliances, and/or any other objects that may be specified in the construction plans. The tagged features may be assigned and identified to locations within the digital model by reference to the coordinate system. Furthermore, the tagged features may be assigned metadata, such as identifying the nature of each feature and any known specifications, e.g. size and type, color, etc. The tagging of each feature may be subsequently updated once vendor/contractor specifications or information have been ingested. It should be understood that where the digital model is a 2D rendering, the coordinate system may only specify two dimensions, with aspects such as wall height and overall structure height being indeterminate.

In operation 310, corrections to the information generated from operations 302-308 may be received, such as from a user interface, or from an external source if the information has been shared. The receipt of corrections, in embodiments, is similar to the receipt of additional data, corrections, and updating of the model discussed above with respect to operations 208, 210, and 214 of method 200 (FIG. 2). The reader is referred to the above discussion of these operations for more details.

Figure 4:
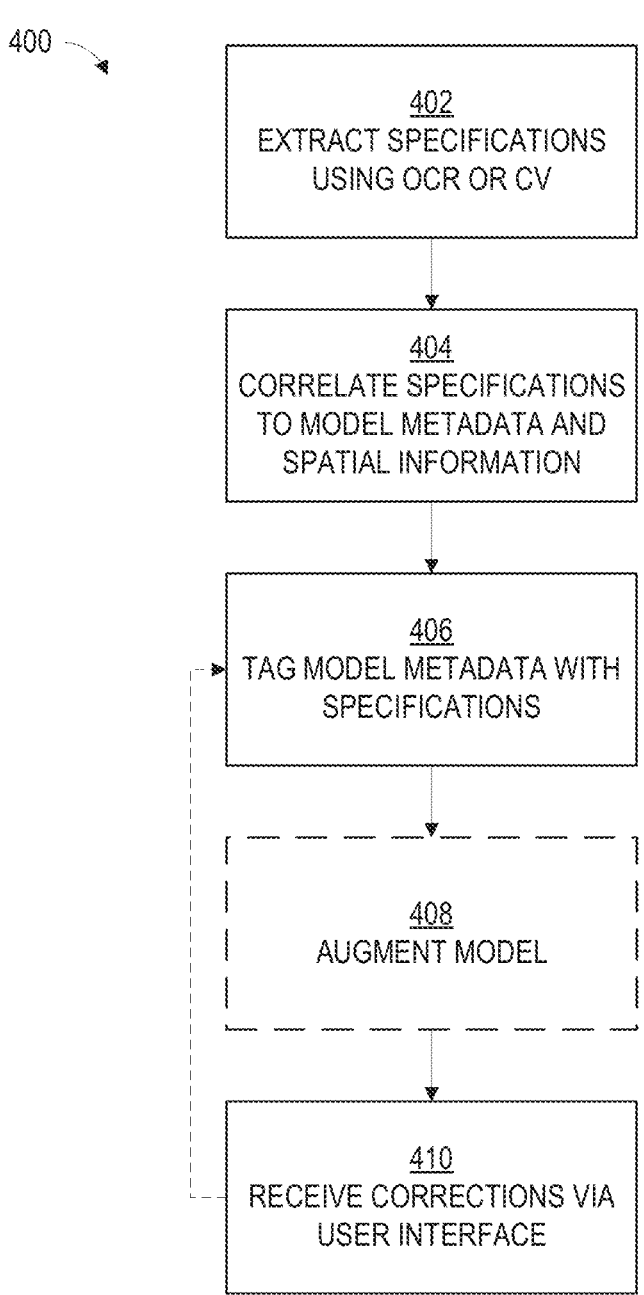
FIG. 4 is a flowchart of the operations for extraction of construction- and building-related specifications for use with a digital twin, according to various embodiments.

FIG. 4 illustrates the operations of an example method 400. Method 400 illustrates possible operations for extraction of spatial information and feature information from vendor/contractor specifications and information, such as information 104 (FIG. 1), to be executed on a computer device 1500. Thus, method 400 may also be considered part of at least operation 204 of method 200. Depending upon the needs of a specific embodiment, the operations of method 400 may be performed in whole or in part, in the depicted order or out of order. Some operations may be omitted or additional operations added.

In operation 402, specifications related to the construction plans may be extracted from vendor/contractor specifications or information, such as information 104 of process flow 100 (FIG. 1). Similar to operation 302 of method 300 (FIG. 3), computer vision may be employed, such as optical character recognition (OCR), object recognition, machine learning and classification, and/or any other suitable technique now known or later developed. The extracted specifications may include quantities, dimensions, colors, textures, and other visual or spatially related information, in addition to related information such as installation instructions, operating manuals, warranty information, maintenance and service instructions, invoices, change orders, and any other similar information relevant to the construction and upkeep of the structure specified in construction plans.

Such specifications or information may be more free form or varied from the construction plans, as construction plans may need to comply with industry-accepted practices for structural plans, while vendor/contractor specifications and information may not have specific or industry-standard formatting. Thus, employing machine learning for processing and classification of the specifications or information may be particularly beneficial in extracting relevant information.

In operation 404, the extracted specifications and information are correlated to the digital model (which may be generated in operation 206 of method 200, FIG. 2), including the model spatial information and tagged metadata, which may be generated in method 300, FIG. 3. For example, the information may specify various cabinets and appliances, the positions of which are indicated in the construction plans. The digital model accordingly reflects these positions with reference to an assigned coordinate system. In the case of appliances, for example, the appliances may have industry-standard sizing, e.g. 27" or 30" for ovens and microwaves, 30" or 36" for ranges, 32" for dishwashers, 32-48" for refrigerators, etc. The appliances specified in the information may be correlated to their respective locations called out in the construction plans. Thus, a refrigerator specified in the vendor information may be correlated to its location in the digital model as specified by the construction plans. Likewise, cabinetry of various sizes may be specified in the information, and then correlated with their associated locations. Construction plans may call for a bank of cabinets in a kitchen, while the vendor information may specify various sizes of cabinetry units that will comprise the bank of cabinets. These units may accordingly be correlated to the bank of cabinets present in the digital model as specified in the construction plans.

Specifications may include finish related information, such as flooring, siding, trim, roofing, paints, and/or other non-structural information. Such information may be correlated to specific areas, such as flooring types that may vary from room to room, different portions of the exterior structure that may have different siding types, different locations for paint colors, e.g. the trim may be one or more colors while the siding a second color or set of colors. Light fixtures may be specified in quantity, and then correlated to multiple locations, such as where a structure has multiple can lights of identical type. Furthermore, specifications may include more personal information, such as furniture, artwork, window treatments, landscaping, and similar information related to a particular structure owner. Such specifications may be generally correlated to a room, but may require user interaction to directly provide a specific location or locations within the digital model for placement.

In operation 406, once the various fixtures, appliances, finishes, and other information have been identified and correlated, the digital model may be tagged with the information corresponding to their correlated specifications. Appliances indicated by the construction plans and located in the digital model may thus be tagged with the various specifications of the actual appliances to be supplied. Thus, viewing a dishwasher in the digital model may allow the user to access specifications of the actual dishwasher model that will be/is installed. Furthermore, as discussed above with respect to method 200 (FIG. 2), the dishwasher in the digital model may further allow access to associated information, such as manuals, service information, replacement parts, etc. Similarly, viewing a particular room may allow a user to see flooring, trim, and/or paint color assigned that room, along with any furniture and/or decorations a user may have added to the digital model. In some embodiments, the implementing system may provide a default or suggested layout of furniture, potentially based on accepted or popular design philosophies, in absence of a user directly specifying furniture locations. Viewing the structure exterior may allow a user to see the exterior finishes.

In some embodiments, a user may be able to view various aspects of the digital model tagged with the contractor/vendor specifications or information and view an actual copy of the underlying specifications or information document(s). For example, the contractor/vendor specifications or information may be provided in the form of a scanned document, PDF, Word, Excel, or another suitable format. The original files used for extraction of specifications in operation 402 may be stored, and tagged in operation 406 so that a user of the digital model can readily view the original documents as part of viewing different aspects of the digital model. Viewing the side of the building may allow a user to pull up the invoice/specifications of the siding, paint colors/color codes, etc.

In operation 408, the digital model may be augmented using the tagged and correlated information. Appliances within the digital model may be re-rendered to approximate the actual appliances to be installed, rather than generic placeholders. The exterior may be rendered in the selected colors and with the selected siding and trim. The interior may be rendered in selected colors and floor coverings. Lighting fixtures may be updated to reflect specified lighting fixture styles. As will be understood, any visual aspect of the digital model may be updated to more accurately reflect information received from the vendor/contractor specifications or information.

In operation 410, corrections to the information generated from operations 402-408 may be received, such as from a user interface, or from an external source if the information has been shared. The receipt of corrections, in embodiments, is similar to the receipt of additional data, corrections, and updating of the model discussed above with respect to operations 208, 210, and 214 of method 200 (FIG. 2). The reader is referred to the above discussion of these operations for more details.

Figure 5:
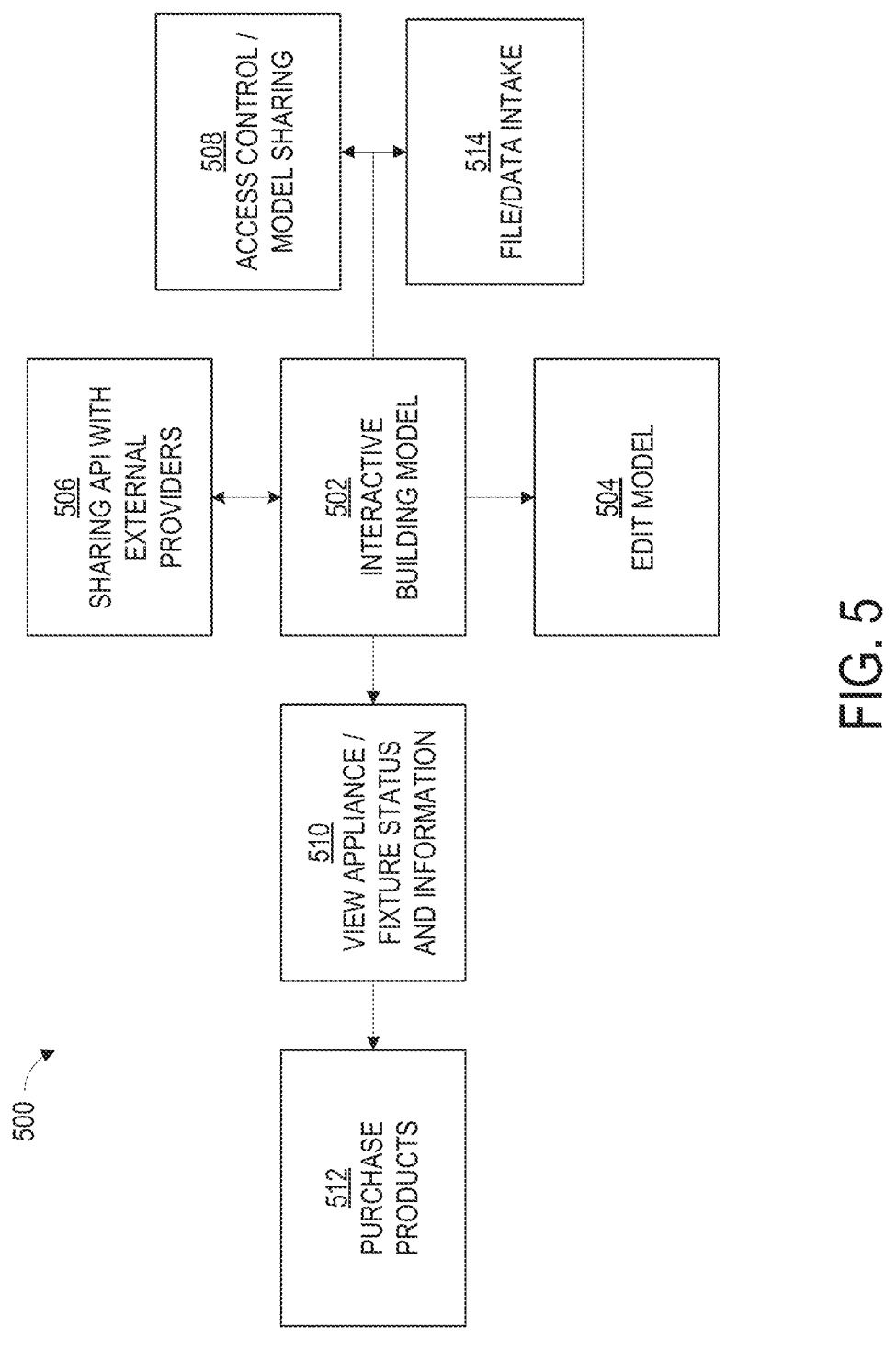
FIG. 5 is a block diagram of interface functionality for viewing and interacting with a digital twin, according to various embodiments.

Turning to FIG. 5, a block diagram of the functions of an example user interface 500 is depicted. Interface 500 may be used to view and interact with a digital model, such as digital model 108 (FIG. 1). The various blocks depicted in FIG. 5 may correspond to one or more screens or views of a graphical user interface and their associated functionality. The specifics of a given interface implementing interface 500 may depend on the needs of a given embodiment. Not all embodiments may implement all aspects of interface 500, and some embodiments may implement additional and/or different aspects beyond those illustrated for interface 500.

In block 502, an interactive building model is presented. In embodiments, the interactive building model is a digital model, such as digital model 108. The digital model may be 2D or 3D, and the user interface may offer various view options to allow a user to select a particular type of view. The interface may further offer view options such as cross sectioning, so that various cutaway views can be generated. The interface may allow cross sectioning into and parallel to a wall, floor, or ceiling plane, so that internal structures may be visible, such as stud, joist, or rafter placement, along with the location of various utility runs, such as plumbing, electrical cabling, and/or HVAC ductwork. In some embodiments, the interface may allow different elements to be selectively viewed or hidden. For example, a user may be able to hide all appliances, furniture, cabinets, and other fixtures, so that a bare structure can be viewed. Other options may allow different parts of the structure to be hidden, or coverings such as drywall or exterior siding to be hidden, to enable more direct viewing of different building structures, including structures not normally visible in a finished structure.

As discussed above, the digital model may allow tagging of various structures with relevant information from the vendor/contractor specifications or information. In some embodiments, viewing the digital model may allow for access to various tagged data and/or materials that correspond to viewed structures. As discussed above, viewing an appliance, for example, may allow a user to access information about the appliance, such as operation and servicing instructions. Viewing siding or a finish of the structure may allow a user to access information about the finish, such as paint color, siding or flooring type and color, quantity, area, reordering information, and/or any other useful information tagged to various aspects of the digital model.

The interactive building model of block 502 may allow for editing of the model, such as with a screen and/or functionality for editing the model, in block 504. The edit model block 504 screen may accept various types of revisions entered by a user. A user may be able to insert objects such as furniture, appliances, cabinets, other fixtures, and/or any other appropriate items allowed for a given implementation. The user further may be able to correct discrepancies between a set of construction plans or vendor/contractor information and the resultant digital model, which may have arisen during the ingestion and analysis phases where the ingested documents are not correctly processed. Thus, edit model screen block 504 allows for input of corrections, thus receiving corrections like discussed above in operations 210 and 214 of FIG. 2, operation 310 of FIG. 3, and/or operation 410 of FIG. 4.

Various tools may be provided on the edit model screen of block 504 depending upon the types of corrections that are facilitated. In some embodiments, the tools may allow for adding, deleting, and/or moving walls and other objects, and/or changing appearances such as paint, floor coverings, siding, trim, shingles, etc. Other tools may include commenting and/or annotation and markup tools, to allow a user to suggest edits or comment on the model. Such tools may be useful in a collaborative environment, where the digital model is shared among and accessible by multiple users, such as the contractor, structure owner, subcontractors, and/or other vendors. Thus, the digital model can facilitate communication among relevant parties responsible for the construction and maintenance of the structure.

In block 506, a screen or screens for controlling the application programming interface (API) for sharing the digital model may be provided. Such screens may allow a user to control access to the digital model that may be available to external systems, such as vendor systems, subcontractor systems, and/or parts suppliers, to name a few non-limiting examples. Controls for sharing the digital model may include either general permissions, e.g. any external user with the right credentials and/or access codes can access the digital model to the extent allowed by the permissions, and/or may allow user-specific sharing, where a given user must either log in and/or provide a unique link, which is associated with permissions specific to the user. The permissions may include read, write, add, delete, and change, to name a few possible permissions, and may be on a global per-model basis or on a subset of the model, such as a room or structure portion, depending upon the specifics of a given embodiment. Other arrangements may be possible; the foregoing are non-limiting examples of possible access controls. Where access is achieved through a specific or unique link, the screens of block 506 may allow for generation and/or dissemination of the unique link.

In block 508, access control and model sharing functionality may be provided. In embodiments, the screen of block 508 may work in tandem with the API screens of block 506. The access control screen(s) of block 508 may allow for the creation, modification, and/or deletion of possible users who may need access to the digital model, and controlling/modifying the level of access such users can have over the model, as discussed above with respect to blocks 504 and 506. Furthermore, the screen(s) of block 508 may provide sharing functionality, where a link or even a separate copy of the digital model can be shared with other users, who may be internal or external to interface 500.

In block 510, one or more screens may allow for viewing of appliance and/or fixture status and information, in various embodiments. Such information may include manuals, as discussed above, but may also include information such as appliance or fixture status, when such information is available. Many modern appliances are equipped with network communications technology, such as WiFi, part of the Internet of Things (IoT) space. A refrigerator may be able to signal over the network when a door is left open, if the temperature has risen or fallen outside of a specified range, if a water filter needs replacing, and/or if some other component is in need of maintenance or replacing, to name a few non-limiting examples. Where such information is tied to the digital model, the status and information screens may allow direct access to the various appliances and/or fixtures, and viewing of any relevant available measurements and/or parameters. Depending on the specifics of a given interface, a user may be able to locate a relevant appliance either graphically on the digital model, and/or in a list of available assets. When viewed or selected, the appliance's status may be shown overlaid or proximate to the representation of the appliance, and/or a link may be provided to access the status information.

As an ancillary to block 510, in block 512 a screen for purchasing products may be provided. The purchasing screen may provide links to various items a given selected or viewed appliance may need. For example, where a refrigerator is being viewed, the purchasing screen of block 512 may include links to vendors who sell replacement parts for the refrigerator, such as water filters. Depending on the needs of a given embodiment, this screen may further include links to order parts for servicing the appliance, such as a new compressor for a refrigerator, or control board for an oven, or another part for servicing the appliance.

Importantly, the purchasing links may be driven by the vendor/contractor information, which may be tagged to the appliance as discussed above. The system implementing interface 500 may understand the make and model of a given appliance, and provide links tailored for the given appliance, to help ensure that the correct parts and maintenance items are ordered. Furthermore, in some embodiments, ordering may be automated. For example, where items such as air filters are on a set replacement schedule, the interface 500 may be configured to automatically place an order for a replacement air filter per the replacement schedule. Alternatively or additionally, interface 500 may be able to automatically order supplies based upon status information, such as feedback from connected devices. For example, a WiFi-connected refrigerator may be able to automatically schedule reordering of a water filter when it is detected to need replacing.

In some embodiments, the available links may be tailored to the specific role a user of the interface 500. For example, the owner of a structure represented in the digital model may be provided links to various user-serviceable maintenance parts, such as water filters, air filters, cleaners, consumable goods, etc., while a service technician, if granted access, may have expanded access to a variety of replacement parts, such as motors, fans, control boards, etc.

Finally, block 514 may include a screen or screens for the ingestion of data for the creation and updating of the interactive building model of block 502, in embodiments. The ingestion screens of block 514 may allow for a user to upload various files like construction plans, such as blueprints 102, and vendor/contractor specifications or information, such as information 104. As mentioned above, the ingestion screens may provide a drag and drop functionality and/or a conventional file browsing interface, to name two possible implementations. Uploading files via the ingestion screen(s) may begin processing and rendering of the interactive building model of block 502.

In some embodiments, the foregoing blocks may or may not be available to a given user, depending upon the user's permissions. The owner of a particular building model may grant selective access to other users that may enable or disable various blocks of interface 500, much the same as the access controls that may be provided for the sharing API, discussed above with respect to block 506. For example, a user only granted read-only or view-only access to a digital model may not be able to access any editing functionality. Such screens may be greyed out, or may simply be unavailable within the interface.

Figure 6:
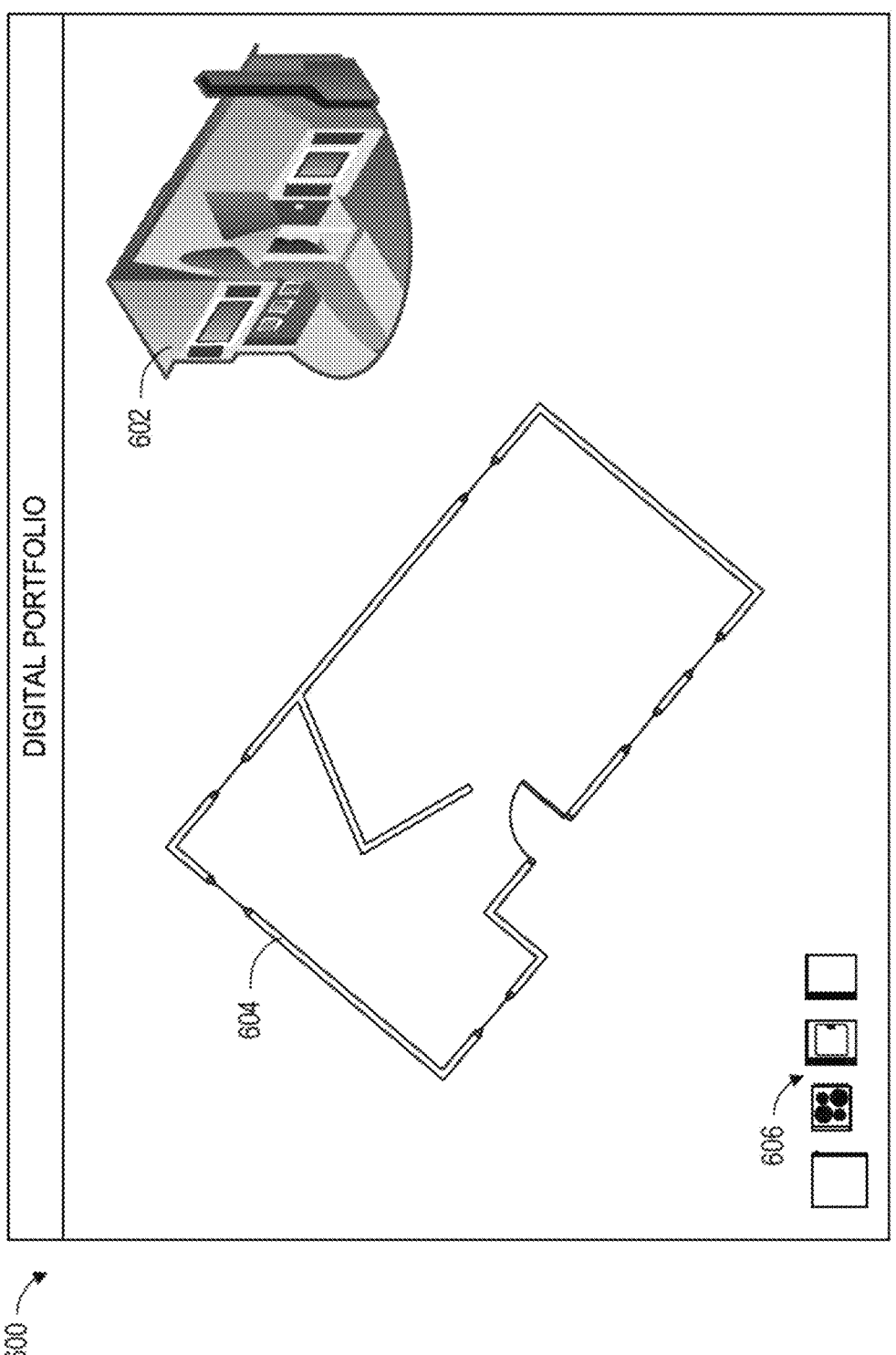
FIGS. 6-8 are example mockups of a possible interface for viewing and interacting with a digital twin, according to various embodiments.

FIG. 6 illustrates an example screen 600 for viewing a digital model, according to a possible embodiment. Screen 600 may be an example of the interactive building model discussed above with respect to block 502 of interface 500 (FIG. 5). As can be seen, screen 600 includes a 3D rendering 602 of the digital model. Also visible is a 2D floor plan 604 for the rendering 602, and a collection of icons 606.

Screen 600 may generate the floor plan 604 from the rendering 602. In embodiments, this generation may be selective. A user of screen 600 may be able to toggle the generation of floor plan 604 such that, in some views, only rendering 602 is visible, and is expanded to fill the interface. Screen 600 may include one or more controls (not shown) for manipulating the model, such as various rotation, zoom, and pan tools. Where both 2D and 3D images are visible, altering the view of one may, in embodiments, cause the view of the other to update to keep the views essentially in synch.

Although not illustrated, viewing of rendering 602 may allow a user to simulate a walk-through of the model. For example, a user may be able to zoom into the rendering and potentially clip through the walls to view the interior of the digital model, such as various rooms, interior decorations, etc. Alternatively or additionally, a user may be able to section the model to expose interior rooms and structures.

Icons 606 may include various objects for insertion into the rendering 602 and/or floor plan 604. In the depicted embodiment, the icons may include various appliances, such as a stove, a refrigerator, a washer, and a dryer, as examples only. Depending on the functionality offered by screen 600, the icons may allow for editing of the digital representation of the structure, such as by modifying the floor plan 604, or the rendering 602. Other suitable functionality may be provided; it should be understood that screen 600 is only one possible example of an interface.

Figure 7:
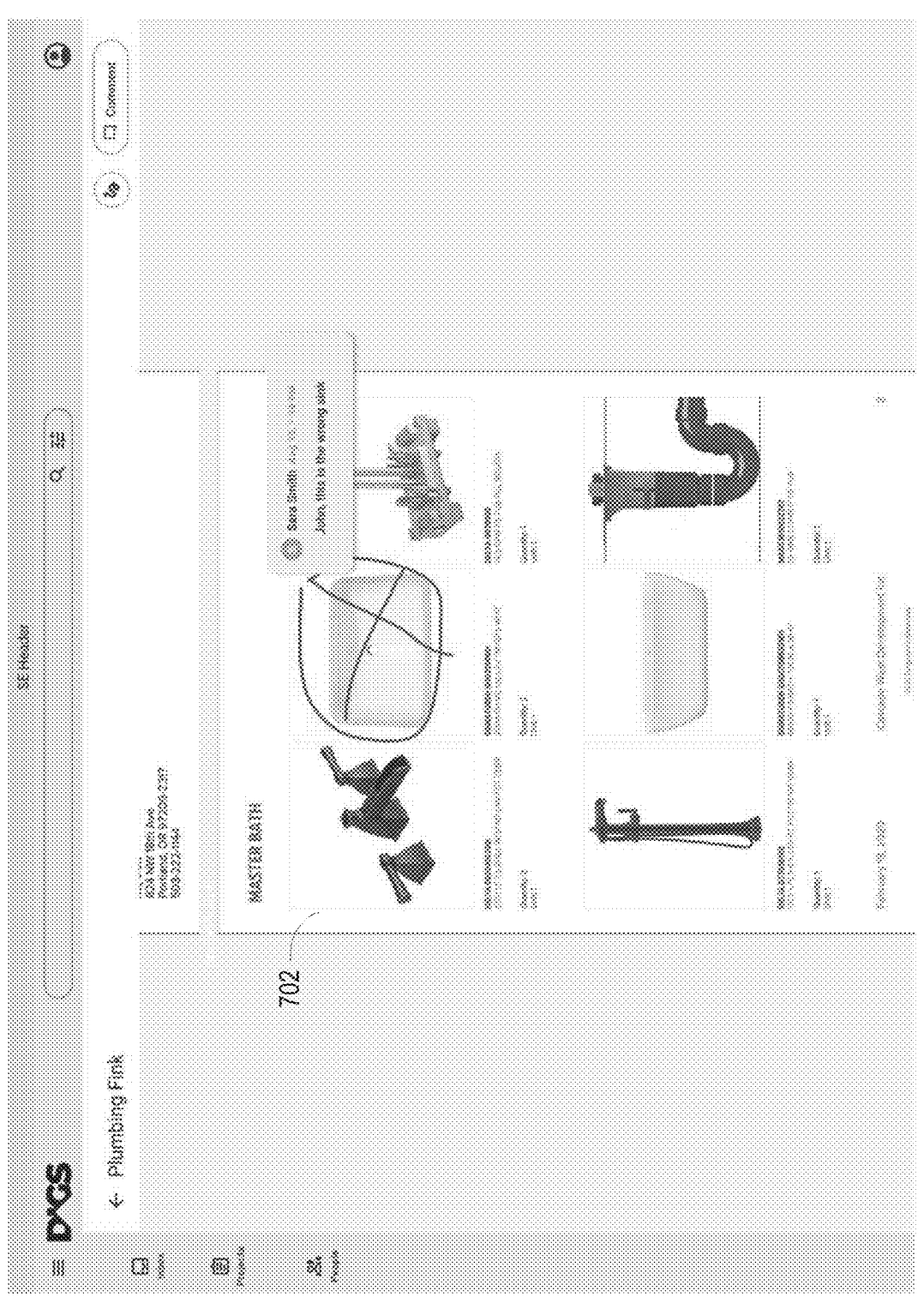

FIG. 7 illustrates a second possible example screen 700. In the depicted embodiment, screen 700 illustrates an inventory list 702 of various specified fixtures for a structure. In the depicted embodiment, inventory list 702 illustrates fixtures for a master bathroom of a house. Inventory list 702 is an example of information 104 (FIG. 1), that may be ingested along with construction plans, and used to enhance a rendering of the building. For example, the various depicted fixtures may be visible if a user zooms into a digital model to view the master bathroom. Notably, the inventory list 702 is illustrated as marked up, with a user indicating in a comment that a specified item is incorrect. Thus, the screen 700 facilitates communication among team members responsible for building the house, potentially allowing errors to be caught prior to the errors causing a delay in construction.

Figure 8:
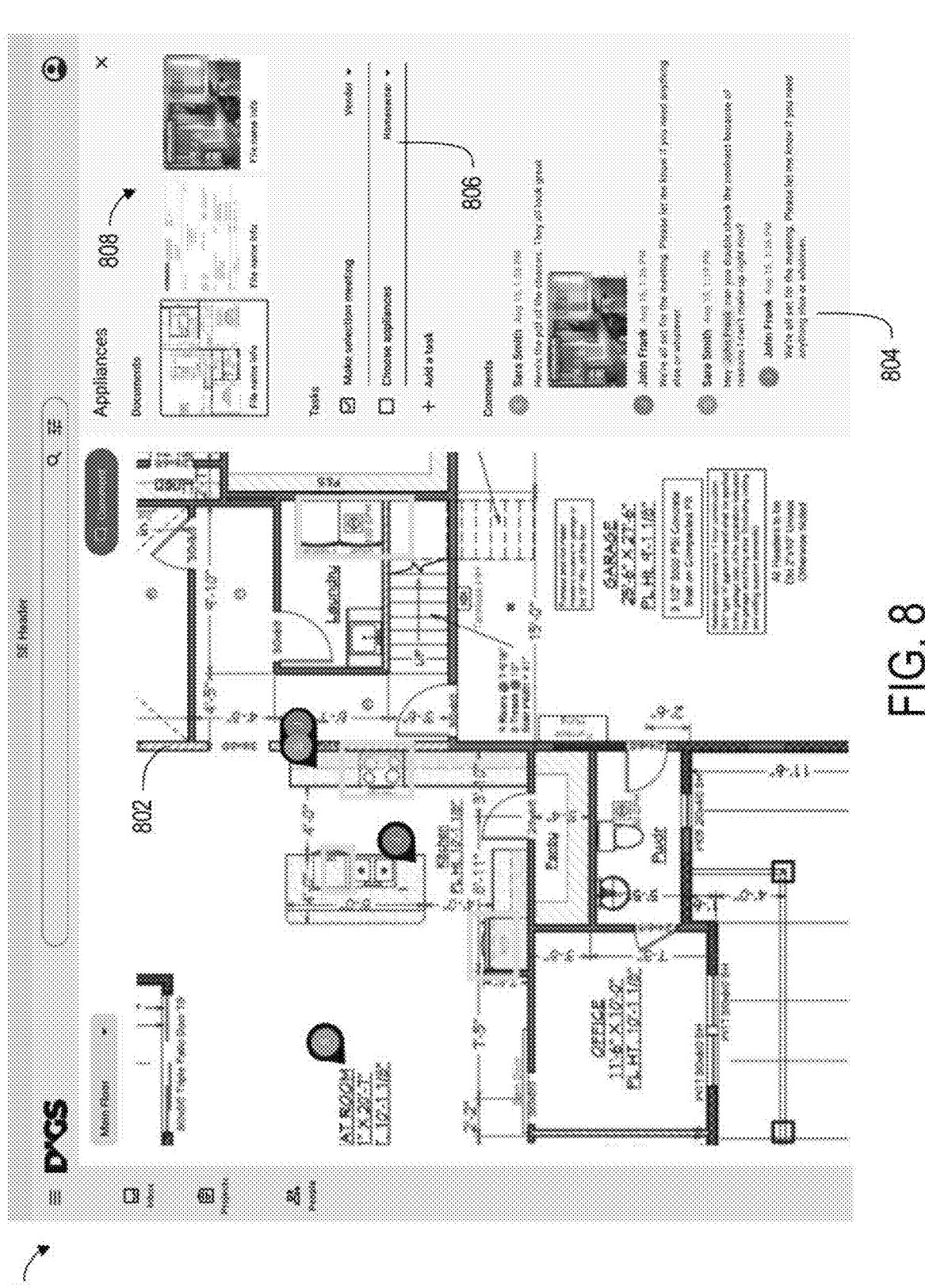

FIG. 8 illustrates a third possible example screen 800. In the depicted embodiment, screen 800 illustrates a floor plan 802, zoomed in on a section illustrating the kitchen and laundry rooms. The floor plan 802 is rendered using standard construction plan styles and iconography. Depending on the specifics of a given embodiment, floor plan 802 may be generated from a digital model, or may be allowing the user to view the actual construction plans that were scanned in to generate the digital model. Various appliances are visible, and a comments window 804 is further visible. The comments window 804 depicts an exchange of comments, akin to a chat conversation, discussing various aspects of the digital model depicted in part by floor plan 802.

Screen 800 further illustrates various possible functions to help in working with the digital model. A task list 806 can be used to help track to-do items while work on the structure is in progress, such as during initial construction, or during subsequent maintenance, renovations, or remodeling. Finally, a series of thumbnails 808 can allow quick access to associated documents, such as construction plans, inventory lists, and other vendor/contractor specifications or information, in the depicted embodiment. Other embodiments may allow quick toggling between views, allowing rapid access to the 3D model or 2D floor plan, or any other suitable functionality.

In some embodiments, financial information may be incorporated into the interface, such as screen 700 or 800. The structure owner may be able to track budgetary information, such as build allowance tracking, to help contain possible cost overruns. Where invoices are ingested as part of information 104 (FIG. 1), these invoices may be automatically factored into the budgetary information. The owner may be able to view a running total of the current construction costs. In embodiments, these costs further may be able to be broken down by various categories, e.g. appliances, fixtures, etc.

It should be understood that screens 600, 700, and 800 may be visible using a web browser or a standalone application. Further, these screens are just one possible example, and should not be taken as constraining to a particular interface look, feel, and layout.

Figure 9:
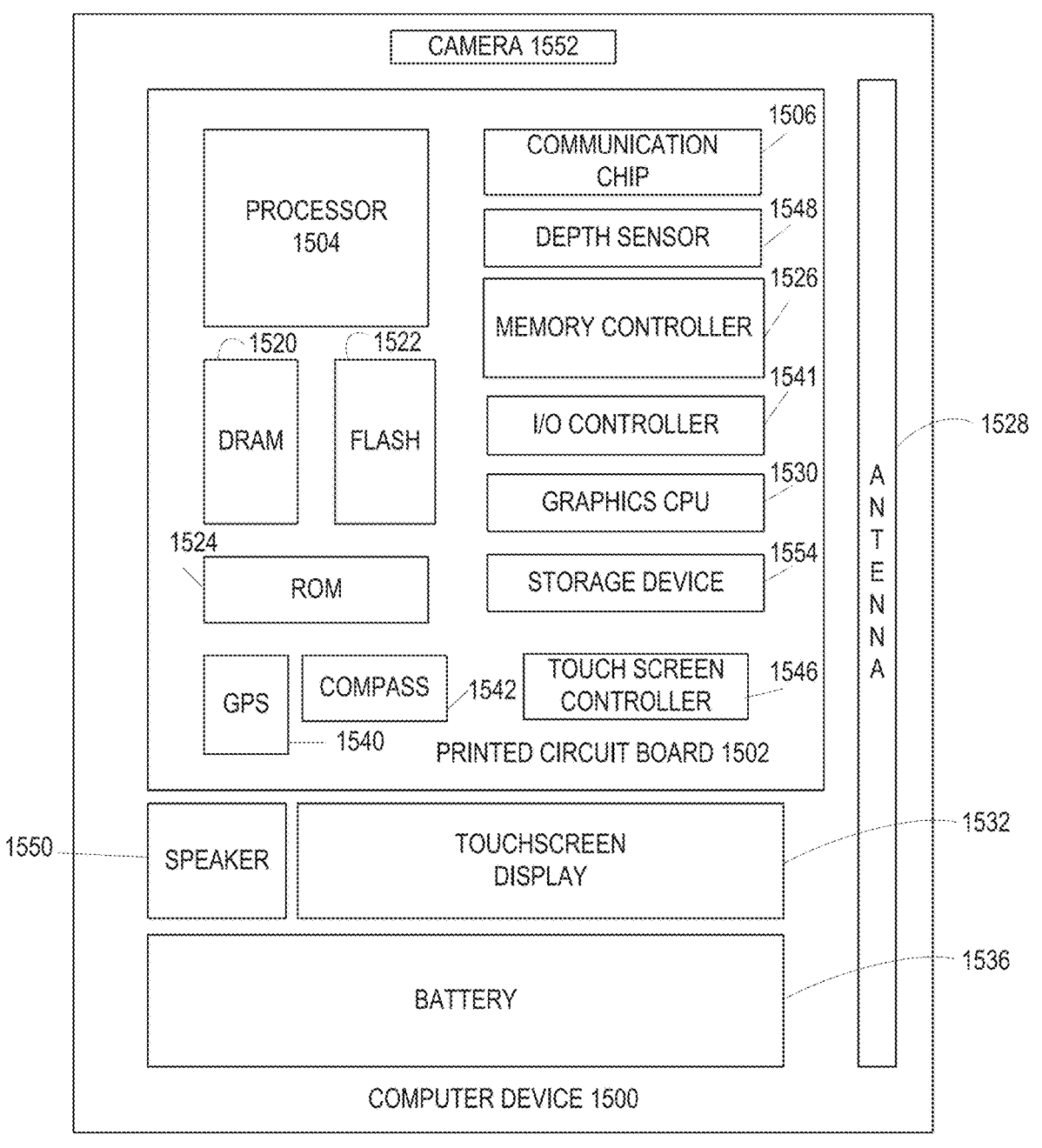
FIG. 9 is a block diagram of an example computer that can be used to implement some or all of the components of the disclosed systems and methods, according to various embodiments.

FIG. 9 illustrates an example computer device 1500 that may be employed by the apparatuses and/or methods described herein, in accordance with various embodiments. As shown, computer device 1500 may include a number of components, such as one or more processor(s) 1504 (one shown) and at least one communication chip 1506. In various embodiments, one or more processor(s) 1504 each may include one or more processor cores. In various embodiments, the one or more processor(s) 1504 may include hardware accelerators to complement the one or more processor cores. In various embodiments, the at least one communication chip 1506 may be physically and electrically coupled to the one or more processor(s) 1504. In further implementations, the communication chip 1506 may be part of the one or more processor(s) 1504. In various embodiments, computer device 1500 may include printed circuit board (PCB) 1502. For these embodiments, the one or more processor(s) 1504 and communication chip 1506 may be disposed thereon. In alternate embodiments, the various components may be coupled without the employment of PCB 1502.

Depending on its applications, computer device 1500 may include other components that may be physically and electrically coupled to the PCB 1502. These other components may include, but are not limited to, memory controller 1526, volatile memory (e.g., dynamic random access memory (DRAM) 1520), non-volatile memory such as read only memory (ROM) 1524, flash memory 1522, storage device 1554 (e.g., a hard-disk drive (HDD)), an I/O controller 1541, a digital signal processor (not shown), a crypto processor (not shown), a graphics processor 1530, one or more antennae 1528, a display, a touch screen display 1532, a touch screen controller 1546, a battery 1536, an audio codec (not shown), a video codec (not shown), a global positioning system (GPS) device 1540, a compass 1542, an accelerometer (not shown), a gyroscope (not shown), a depth sensor 1548, a speaker 1550, a camera 1552, and a mass storage device (such as hard disk drive, a solid state drive, compact disk (CD), digital versatile disk (DVD)) (not shown), and so forth.

In some embodiments, the one or more processor(s) 1504, flash memory 1522, and/or storage device 1554 may include associated firmware (not shown) storing programming instructions configured to enable computer device 1500, in response to execution of the programming instructions by one or more processor(s) 1504, to practice all or selected aspects of process flow 100, method 200, method 300, method 400, interface 500, and/or example screens 600-800, described herein. In various embodiments, these aspects may additionally or alternatively be implemented using hardware separate from the one or more processor(s) 1504, flash memory 1522, or storage device 1554.

The communication chips 1506 may enable wired and/or wireless communications for the transfer of data to and from the computer device 1500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1506 may implement any of a number of wireless standards or protocols, including but not limited to IEEE 802.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computer device 1500 may include a plurality of communication chips 1506. For instance, a first communication chip 1506 may be dedicated to shorter range wireless communications such as Wi-Fi and Bluetooth, and a second communication chip 1506 may be dedicated to longer range wireless communications such as GPS, EDGE, GPRS, CDMA, WiMAX, LTE, Ev-DO, and others.

In various implementations, the computer device 1500 may be a laptop, a netbook, a notebook, an ultrabook, a smartphone, a computer tablet, a personal digital assistant (PDA), a desktop computer, smart glasses, or a server. In further implementations, the computer device 1500 may be any other electronic device that processes data.

As will be appreciated by one skilled in the art, the present disclosure may be embodied as methods or computer program products. Accordingly, the present disclosure, in addition to being embodied in hardware as earlier described, may take the form of an entirely software embodiment (including firmware, resident software, micro-code, etc.) or an embodiment combining software and hardware aspects that may all generally be referred to as a "circuit," "module" or "system." Furthermore, the present disclosure may take the form of a computer program product embodied in any tangible or non-transitory medium of expression having computer-usable program code embodied in the medium.

FIG. 10 illustrates an example computer-readable non-transitory storage medium that may be suitable for use to store instructions that cause an apparatus, in response to execution of the instructions by the apparatus, to practice selected aspects of the present disclosure. As shown, non-transitory computer-readable storage medium 1602 may include a number of programming instructions 1604. Programming instructions 1604 may be configured to enable a device, e.g., computer 1500, in response to execution of the programming instructions, to implement (aspects of) process flow 100, method 200, method 300, method 400, interface 500, and/or example screens 600-800 described above. In alternate embodiments, programming instructions 1604 may be disposed on multiple computer-readable non-transitory storage media 1602 instead. In still other embodiments, programming instructions 1604 may be disposed on computer-readable transitory storage media 1602, such as, signals.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present disclosure is described with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:

1. A method, comprising:
receiving, at a server, one or more files containing specifications for construction of a structure;
extracting, by the server from the specifications, information about a design of the structure;
generating, by the server from the extracted information, a virtual model of the structure;
receiving, at the server, an inventory list;
extracting, by the server, metadata from the inventory list; and
tagging the virtual model of the structure with the metadata.

2. The method of claim 1, wherein the specifications comprise a blueprint.

3. The method of claim 1, wherein extracting the information about the structure design comprises providing the specification to a machine learning system.

4. The method of claim 1, wherein generating the virtual model of the structure comprises generating a three-dimensional view.

5. The method of claim 1, wherein generating the virtual model of the structure comprises generating a two-dimensional view.

6. The method of claim 1, wherein generating the virtual model of the structure comprises assigning a coordinate system to the virtual model.

7. The method of claim 1, wherein generating the virtual model of the structure comprises rendering one or more fixtures.

8. The method of claim 1, further comprising:
receiving, at the server, one or more changes to the virtual model; and
updating, by the server, the virtual model to reflect the one or more changes.

9. The method of claim 1, further comprising:
receiving, at the server, one or more files of revised specifications;
extracting, from the revised specifications, additional information about the structure design;
comparing, by the server, the additional information from the revised specifications with the information about the structure design; and
updating, by the server, the virtual model to reflect the additional information.

10. The method of claim 9, further comprising verifying, by the server, the information about the structure design with the additional information to detect any potential inconsistencies.

11. A non-transitory computer readable medium (CRM) comprising instructions that, when executed by an apparatus, cause the apparatus to:
receive one or more files containing specifications for construction of a structure;
extract, from the specifications, information about a design of the structure;
generate, from the extracted information, a digital model of the structure;
receive an inventory list;
extract metadata from the inventory list; and
tag the digital model of the structure with the metadata.

12. The CRM of claim 11, wherein the specifications comprise a blueprint and one or more vendor specifications.

13. The CRM of claim 11, wherein the instructions are to cause the apparatus to extract the information about the structure design with a machine learning system.

14. The CRM of claim 11, wherein the instructions are to cause the apparatus to generate the digital model of the structure as a three-dimensional view.

15. The CRM of claim 11, wherein the instructions are to cause the apparatus to generate the digital model of the structure as a two-dimensional view.

16. The CRM of claim 11, wherein the instructions are to cause the apparatus to assign a coordinate system to the digital model.

17. The CRM of claim 11, wherein the instructions are to cause the apparatus to render one or more fixtures into the digital model.

18. The CRM of claim 11, wherein the instructions are to further cause the apparatus to:
receive one or more changes to the digital model; and
update the digital model to reflect the one or more changes.

19. The CRM of claim 11, wherein the instructions are to further cause the apparatus to:

receive one or more files of revised specifications;

extract, from the revised specifications, additional information about the structure design;

compare the additional information from the revised specifications with the information about the structure design; and update the digital model to reflect the additional information.

20. The CRM of claim 19, wherein the instructions are to further cause the apparatus to verify the information about the structure design with the additional information to detect any potential inconsistencies.

\* \* \* \* \*